United States Patent
Morisue et al.

(10) Patent No.: US 7,521,383 B2
(45) Date of Patent: Apr. 21, 2009

(54) MANUFACTURING METHOD OF SEMICONDUCTOR DEVICE

(75) Inventors: Masafumi Morisue, Sagamihara (JP); Ryosuke Watanabe, Kanagawa (JP); Junya Maruyama, Kanagawa (JP); Daiki Yamada, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 165 days.

(21) Appl. No.: 11/425,559

(22) Filed: Jun. 21, 2006

(65) Prior Publication Data
US 2007/0004233 A1 Jan. 4, 2007

(30) Foreign Application Priority Data
Jun. 30, 2005 (JP) ............................. 2005-192520

(51) Int. Cl.
*H01L 21/00* (2006.01)
(52) U.S. Cl. ..................... 438/799; 438/940; 438/458; 257/E21.328; 257/331; 257/596
(58) Field of Classification Search ................. 438/940, 438/690, 799, 800, 798, 458; 257/E21.328, 257/E21.331, E21.347, E21.596
See application file for complete search history.

(56) References Cited

U.S. PATENT DOCUMENTS

| | | | | |
|---|---|---|---|---|
| 5,258,236 A | * | 11/1993 | Arjavalingam et al. | 428/626 |
| 5,650,639 A | * | 7/1997 | Schrantz et al. | 257/77 |
| 5,727,104 A | * | 3/1998 | Sasaki et al. | 385/92 |
| 6,127,199 A | | 10/2000 | Inoue et al. | |
| 6,372,608 B1 | | 4/2002 | Shimoda et al. | |
| 6,521,511 B1 | | 2/2003 | Inoue et al. | |
| 6,627,518 B1 | | 9/2003 | Inoue et al. | |
| 6,645,830 B2 | | 11/2003 | Shimoda et al. | |
| RE38,466 E | | 3/2004 | Inoue et al. | |
| 6,700,631 B1 | | 3/2004 | Inoue et al. | |
| 6,818,530 B2 | | 11/2004 | Shimoda et al. | |
| 6,878,607 B2 | | 4/2005 | Inoue et al. | |
| 6,885,389 B2 | | 4/2005 | Inoue et al. | |
| 7,094,665 B2 | | 8/2006 | Shimoda et al. | |
| 7,189,631 B2 | | 3/2007 | Yamazaki et al. | |
| 7,335,573 B2 | | 2/2008 | Takayama et al. | |
| 7,351,300 B2 | | 4/2008 | Takayama et al. | |
| 2002/0086137 A1 | * | 7/2002 | Brouillette et al. | 428/138 |

(Continued)

FOREIGN PATENT DOCUMENTS

EP 1 351 308 10/2003

(Continued)

*Primary Examiner*—Caridad M Everhart
(74) *Attorney, Agent, or Firm*—Fish & Richardson P.C.

(57) ABSTRACT

A first layer (an insulating layer), a second layer (a metal layer), and a third layer (an insulating layer) are formed over a substrate. Then, a fourth layer including a semiconductor element is formed over the third layer. After applying an organic resin film covering the fourth layer, laser light is irradiated to sections of a rear surface side of the substrate. By irradiating the second layer with laser light, the state of being covered with the organic resin film can be maintained at the same time as forming a space under the organic resin film by ablating (alternatively, evaporating or breaking down) an irradiated region of the second layer, to cause a lift in the film in a periphery thereof.

20 Claims, 11 Drawing Sheets

U.S. PATENT DOCUMENTS

| | | |
|---|---|---|
| 2002/0146893 A1 | 10/2002 | Shimoda et al. |
| 2003/0008437 A1 | 1/2003 | Inoue et al. |
| 2003/0032210 A1 | 2/2003 | Takayama et al. |
| 2003/0040164 A1 | 2/2003 | Inoue et al. |
| 2003/0047280 A1 | 3/2003 | Takayama et al. |
| 2003/0224582 A1 | 12/2003 | Shimoda et al. |
| 2004/0129960 A1 | 7/2004 | Maruyama et al. |
| 2004/0219762 A1 | 11/2004 | Shimoda et al. |
| 2004/0259329 A1* | 12/2004 | Boyle et al. .................. 438/460 |
| 2006/0002047 A1* | 1/2006 | Cheung et al. ............... 361/118 |
| 2006/0023990 A1* | 2/2006 | Shih et al. ..................... 385/14 |
| 2006/0040471 A1* | 2/2006 | Ramanathan et al. ....... 438/459 |
| 2006/0270189 A1 | 11/2006 | Ogita et al. |
| 2007/0158745 A1 | 7/2007 | Yamazaki et al. |
| 2007/0164337 A1* | 7/2007 | Adkisson et al. ............ 257/295 |
| 2008/0049437 A1 | 2/2008 | Takayama et al. |

FOREIGN PATENT DOCUMENTS

| | | |
|---|---|---|
| EP | 1 014 452 | 5/2006 |
| EP | 0 924 769 | 9/2006 |
| EP | 0 858 110 | 12/2006 |
| JP | 10-125929 | 5/1998 |
| JP | 10-125930 | 5/1998 |
| JP | 10-125931 | 5/1998 |
| JP | 11-243209 | 9/1999 |
| JP | 2001-189460 | 7/2001 |
| JP | 2003-163338 | 6/2003 |
| WO | 2006/123825 | 11/2006 |

* cited by examiner

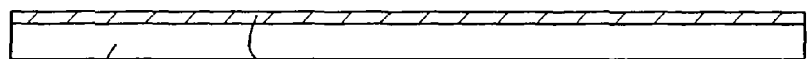
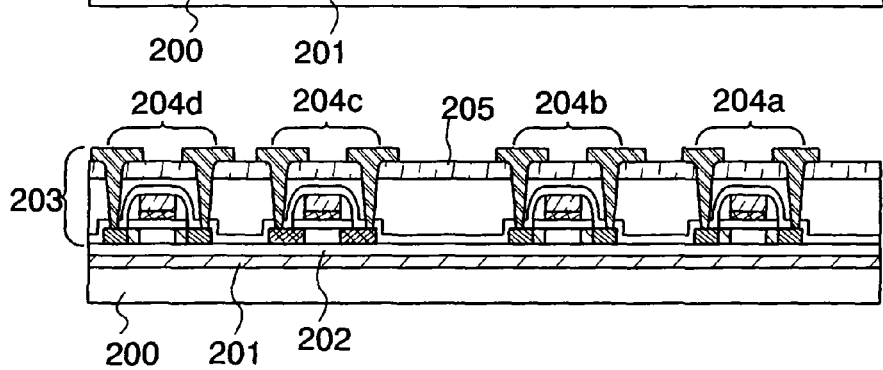
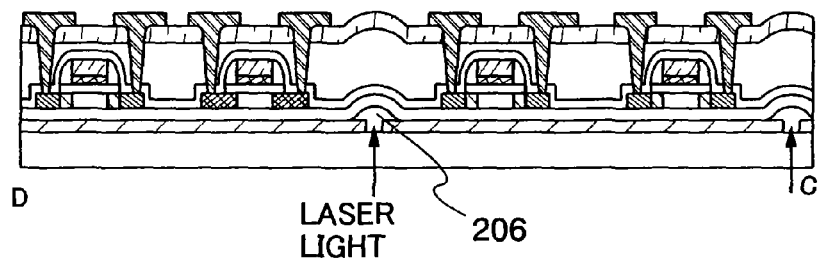
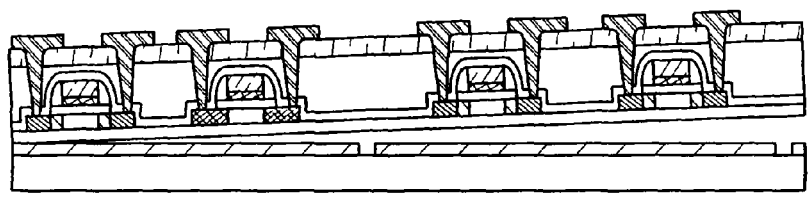

MANUFACTURING METHOD OF
SEMICONDUCTOR DEVICE

BACKGROUND OF THE INVENTION

1. Field of the Invention

The present invention relates to a semiconductor device including a circuit structured by a thin film transistor (hereinafter referred to as "TFT"), and a manufacturing method thereof. For example, the present invention relates to an electronic appliance to which a light emitting display device including an organic light emitting element or an electro-optic device typified by a liquid crystal display panel is mounted as a part.

Note that in this specification, a semiconductor device refers to devices in general which function by utilizing a semiconductor characteristic. Electro-optic devices, semiconductor circuits, and electronic appliances are all semiconductor devices.

2. Description of the Related Art

In recent years, a lot of attention have been paid to a technology of forming a semiconductor device including a thin film transistor (TFT), by using a semiconductor thin film (thickness of about several to several hundred nm) that is formed over a substrate having an insulating surface.

Among such semiconductor devices, there is a technology of forming a peeling layer and a transistor over a substrate in this order, and then subsequently forming a trigger for peeling. For example, in Patent Document 1: Japanese Patent Laid-Open No. 2003-163338 by the present applicant, forming a trigger for peeling using a laser is mentioned.

SUMMARY OF THE INVENTION

An object of the present invention is to provide a peeling method that does not damage a layer to be peeled, and enable peeling of a layer to be peeled without peeling defectively over an entire surface, not only for peeling a layer to be peeled that has a small area, but also for a layer to be peeled that has large area.

Another object of the present invention is to provide a semiconductor device for which weight is reduced by sticking a layer to be peeled on various base materials, and a manufacturing method thereof. In particular, an object is to provide a semiconductor device for which weight is reduced by sticking various elements typified by a TFT (a thin film diode, a photoelectric conversion element made of a PIN junction of silicon (such as solar battery, and a sensor), a silicon resistance element, or an antenna element) on flexible films, and a manufacturing method thereof.

Prior to peeling, it is important to form a trigger to make a peeling phenomenon easy to occur. By carrying out a pretreatment for selectively (partially) decreasing adhesiveness, defective peeling is eliminated, and yield increases as well.

In the present invention, after forming a first layer (an insulating layer), a second layer (a metal layer), and a third layer (an insulating layer) over a substrate, a fourth layer including a semiconductor element is formed over the third layer; subsequently, after applying an organic resin film covering the fourth layer, laser light is emitted to sections of a rear surface side of the substrate. By irradiating the second layer with laser light, the state of being covered by the organic resin film can be maintained at the same time as forming a space under the organic resin film by ablating (alternatively, evaporating or breaking down) an irradiated region of the second layer, to cause a lift in the film in a periphery thereof. By covering with the organic resin film, damage to the fourth layer can be suppressed.

This lift in the film is a phenomenon, in which the third layer and a layer laminated over the third layer is raised by a space formed at an interface of the second layer and the third layer. Note that when energy of laser light to be emitted is strong, sometimes the third layer overlapping a region irradiated with laser light and a layer laminated over the third layer (for example, the fourth layer or the organic resin film) are also evaporated or broken down. By covering with the organic resin film, generation of particles can be suppressed.

In the foregoing manufacturing method of a semiconductor device, a layer including an oxide or a nitride of silicon is formed as the first layer. As the second layer, a layer including tungsten or molybdenum is formed. As the third layer, a layer including an oxide or a nitride of silicon is formed. As the fourth layer, a thin film transistor and a conductive layer functioning as an antenna are formed.

Note that the step of forming the first layer may be omitted.

One feature of the present invention is to form a thin film transistor and a conductive layer functioning as an antenna as the fourth layer. By the foregoing feature, a semiconductor device manufactured by the present invention has a function of carrying out sending and receiving of electromagnetic waves.

One feature of a structure of the invention disclosed in this specification is a manufacturing method of a semiconductor device in which a metal layer is formed over a substrate having a light transmitting property; an insulating layer is formed over the metal layer; a layer including an element is formed over the insulating layer; a resin material is applied over the layer including an element; the resin material is cured; irradiation with intense light is selectively carried out from a rear surface side of the substrate; and the metal layer in a region selectively irradiated with intense light is ablated.

It is one of the features of the present invention that in the foregoing structure, the region selectively irradiated with intense light is a border between an element and a rim of the substrate.

Further, in a case of forming a plurality of circuits over a large-area substrate and manufacturing a plurality of chips, one feature of another structure of the present invention is a manufacturing method of a semiconductor device in which a metal layer is formed over a substrate having a light transmitting property; an insulating layer is formed over the metal layer; a layer including a first element and a second element is formed over the insulating layer; a resin material is applied over the layer including the first element and the second element; the resin material is cured; irradiation with intense light is selectively carried out from a rear surface side of the substrate; and peeling is carried out from the region selectively irradiated with intense light to separate the substrate and the layer including the first element and the second element.

It is one of the features of the present invention that in each of the foregoing structures, in the region selectively irradiated with intense light and a periphery thereof, a space is formed between the metal layer and the insulating layer.

It is one of the features of the present invention that in the foregoing structure, the region selectively irradiated with intense light is a border between the first element and the second element; a border between the first element and a rim of the substrate; or a border between the second element and the rim of the substrate.

Further, one feature of another structure of the present invention is a manufacturing method of a semiconductor device in which a metal layer is formed over a substrate having a light transmitting property; an insulating layer is formed over the metal layer; a layer including a plurality of elements is formed over the insulating layer; a resin material is applied over the layer including a plurality of elements; the resin material is cured; irradiation with intense light is selectively carried out from a rear surface side of the substrate to remove a portion of the metal layer; and peeling is carried out to separate the substrate and the layer including a plurality of elements.

Further, one feature of another structure of the present invention is a manufacturing method of a semiconductor device in which a metal layer is formed over a substrate having a light transmitting property; an insulating layer is formed over the metal layer; a layer including a plurality of elements as well as at least one layer of an organic resin layer is formed over the insulating layer; irradiation with intense light is selectively carried out from a rear surface side of the substrate to remove a portion of the metal layer; and peeling is carried out to separate the substrate and the layer including a plurality of elements.

Also, it is one of the features of the present invention that in each of the foregoing structures, the intense light is laser light, and a region selectively irradiated with the intense light has a dot form or a linear form.

By the present invention, a trigger for peeling can be formed in a state with practically no damage to a layer including an element by emitting laser light to sections of a rear surface, and the layer including an element can be peeled from a substrate smoothly.

By the present invention, a manufacturing method of a semiconductor device with reduced manufacturing cost can be provided. Also, a manufacturing method of a semiconductor device with reduced manufacturing time and improved productivity can be provided.

BRIEF DESCRIPTION OF DRAWINGS

In the accompanying drawings:

FIGS. 6A to 6D are cross-sectional views of a manufacturing process of a semiconductor device according to Embodiment Mode 2;

DETAILED DESCRIPTION OF THE INVENTION

Embodiment Mode

Figure 1A:
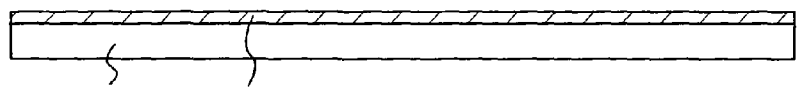
FIGS. 1A to 1E are cross-sectional views of a manufacturing process of a semiconductor device according to Embodiment Mode 1.

Embodiment modes of the present invention will hereinafter be described with reference to drawings. However, the invention is not limited to the following description, and it is easily understood by those skilled in the art that the modes and details can be changed in various ways without departing from the spirit and scope of the invention. Therefore, the invention is not interpreted limited to the following description of embodiment modes. In the structure of the invention described hereinafter, reference numerals indicating the same things may be used in common in different drawings.

Embodiment Mode 1

As shown in FIG. 1A, a substrate 100 is prepared and a peeling layer 101 is provided over the substrate 100. Specifically, as the substrate 100, for example, a glass substrate such as a barium borosilicate glass substrate or an alumino-borosilicate glass substrate, a quartz substrate, a ceramic substrate, or the like can be used. A metal substrate including stainless steel, or a semiconductor substrate with an insulating film formed over a surface thereof may also be used. The substrate 100 may be thinned or planarized by a polishing method such as mechanical polishing or CMP (chemical mechanical polishing). A substrate formed of a flexible synthetic resin such as plastic generally tends to have a lower heat resistance temperature than the aforementioned glass substrate, quartz substrate, and ceramic substrate; however, a substrate formed of a flexible synthetic resin such as plastic can be used as the substrate 100 as long as the substrate 100 can withstand treatment temperature in the manufacturing steps.

The peeling layer 101 is formed of a metal film which mainly contains an element selected from tungsten (W), titanium (Ti), molybdenum (Mo), niobium (Nb), nickel (Ni), cobalt (Co), zirconium (Zr), zinc (Zn), ruthenium (Ru), rhodium (Rh), palladium (Pd), osmium (Os), and iridium (Ir). In this embodiment mode, a metal film which mainly contains tungsten is used as the peeling layer 101. Note that a method for forming the metal film is a sputtering method, a CVD method, or the like, and in this embodiment mode, a sputtering method is used to form the metal film.

Metal oxide is formed over the metal film, and the metal film and the metal oxide can be used as the peeling layer 101. In other words, the peeling layer 101 is a layer including a metal film. When the metal film mainly contains tungsten, the metal oxide is tungsten oxide. Tungsten oxide is represented by $WO_x$, where x is 2 to 3. There are cases where x is 2 ($WO_2$), x is 2.5 ($W_2O_5$), x is 2.75 ($W_4O_{11}$), x is 3 ($WO_3$), and the like. In forming tungsten oxide $WO_x$, it is acceptable as long as the value of x is within the above range. In addition, as a combination of a metal film and a metal oxide film formed over the metal film, molybdenum and molybdenum oxide, niobium and niobium oxide, titanium and titanium oxide, and the like can be given.

The aforementioned metal oxide can be formed by plasma oxidation of the metal film. When plasma oxidation is performed, high quality metal oxide which suppresses plasma damage can be obtained by using an apparatus capable of generating with no magnetic field a plasma having high electron density of $1 \times 10^{11}$ $cm^{-3}$ or more, for example, $1 \times 10^{12}$ $cm^{-3}$ to $1 \times 10^{13}$ $cm^{-3}$ and low electron temperature of 1.5 eV or less, for example, 0.5 eV to 1.0 eV. Formation of the metal film and formation of the metal oxide may be continuously carried out. At that time, a multi-chamber apparatus provided with a chamber for sputtering or CVD and a chamber for plasma treatment can be used.

In FIG. 1A, the peeling layer 101 is formed directly on the substrate 100; however, a base layer which is not shown here may be formed of an insulating film of silicon oxide, silicon nitride, silicon oxide containing nitrogen (silicon oxynitride), silicon nitride containing oxygen, or the like between the substrate 100 and the peeling layer 101. In particular, in the case where contamination from the substrate is a concern, the base layer is preferably formed. When a glass substrate or a quartz substrate is used as the substrate 100, the base layer can be formed by plasma oxidation or plasma nitridation of a surface of the substrate 100 with an apparatus which can generate with no magnetic field the aforementioned plasma having high electron density and low electron temperature. Alternatively, the base layer may be formed by carrying out plasma oxidation or plasma nitridation on the aforementioned insulating film which is formed by a CVD method with an apparatus capable of generating with no magnetic field the plasma having high electron density and low electron temperature. Formation of the insulating film and either plasma oxidation or plasma nitridation may be continuously carried out. At that time, a multi-chamber apparatus provided with a chamber for CVD and a chamber for plasma treatment can be used.

If necessary, an insulating layer 102 is provided over the peeling layer 101. The insulating layer 102 may be formed of silicon oxide, silicon nitride, silicon nitride containing oxygen, silicon oxide containing nitrogen (silicon oxynitride), or the like by for example a CVD method.

Figure 1B:
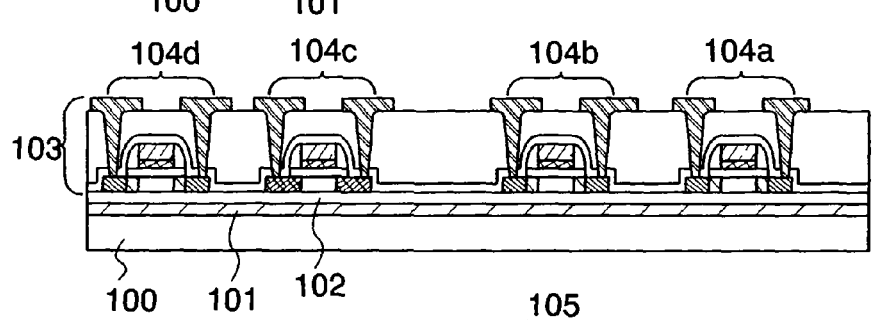

Next, a layer including a transistor is formed over the peeling layer 101 (when an insulating layer 102 is formed, the layer including a transistor is formed over the insulating layer 102). In this embodiment mode, a thin film transistor is used as a transistor. A layer 103 including a thin film transistor includes a thin film transistor, a wire extending from a gate electrode, a wire connected to a source or drain region, and an interlayer insulating film. FIG. 1B shows an example of the layer 103 including a thin film transistor. In this example, the layer 103 including a thin film transistor further includes a side wall formed of silicon oxide or the like at a side surface of the gate electrode, and a passivation film made of an inorganic insulator such as silicon nitride, which is provided so as to cover the gate electrode, the source region, and the drain region. The thin film transistor is not limited to the structure shown in FIG. 1B and may be, for example, a multigate structure where two or more thin film transistors are serially connected; a structure where gate electrodes are provided over and under an active layer including a channel region via insulating films; or an inversely staggered type where a gate electrode is provided between an active layer including a channel region and a substrate via a gate insulating film. In addition, any of an n-channel type thin film transistor, a p-channel type thin film transistor, or a combination thereof may be used in accordance with a semiconductor device to be manufactured.

Each gate electrode of a thin film transistor in circuits 104a, 104b, 104c, and 104d each including a thin film transistor shown in FIG. 1B is formed with at least two layers. For example, a bottom layer of each of these gate electrodes can be formed with a layer mainly containing a metal oxide (such as titanium nitride, tantalum nitride, and tungsten nitride) having a conductive property, and an upper layer of each of these gate electrodes can be formed with a layer mainly containing refractory metal (such as titanium, molybdenum, tantalum, and tungsten). Then, for a thin film transistor in each of the circuits 104a, 104c, and 104d each including a thin film transistor, an LDD region is provided between a source or drain region and a channel forming region, and in a thin film transistor in the circuit 104b including a thin film transistor, an LDD region is not provided. A CMOS circuit can be formed by having the thin film transistor in the circuit 104b including a thin film transistor as a p-channel type, and combining it in a complementary style with an n-channel type.

In each of the thin film transistors of the circuits 104a, 104c, and 104d each including a thin film transistor, in order to easily form the LDD region, the source region, and the drain region by using the gate electrode as a mask, the bottom layer of the gate electrode is formed so as to overlap the layer with the LDD region by making a gate length of the bottom layer longer than a gate length of the upper layer.

A semiconductor material for forming an active layer including a channel formation region in each of the circuits 104a, 104b, 104c, and 104d each including a thin film transistor can be selected from materials including silicon, germanium, or both of silicon and germanium, and in addition, an optimal structure can be selected from polycrystalline, monocrystalline, microcrystalline, and amorphous structures. A polycrystalline silicon film is obtained by crystallizing an amorphous silicon film using a metal such as nickel by a heat treatment at a temperature equal to or less than a strain point of a glass substrate, and then removing the metal such as nickel from the crystallized film by gettering. A polycrystalline silicon film may be formed by irradiating an amorphous silicon film with a laser beam which is absorbed by the amorphous silicon film, for example, a laser beam with a wavelength in an ultraviolet light region. When a quartz substrate is used as the substrate 100, a polycrystalline silicon film can be obtained by crystallizing an amorphous silicon film through heating at a temperature of 800° C. or more without using a metal such as nickel. Thus, a step of removing a metal such as nickel by gettering is not necessary.

Figure 1C:
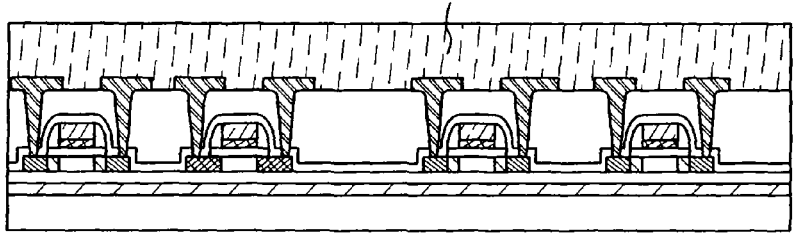

Next, a resin is applied over the layer 103 including a thin film transistor, then the resin is cured through a heat treatment with a heating apparatus such as an oven or a furnace to form a resin layer 105 (see FIG. 1C).

As a method for applying a resin to form the resin layer 105, a screen printing method, a spin coating method, a droplet discharging method, a dip coating method or the like can be used.

As a resin material that is applied here, an appropriate material is selected from a heat curable resin, an ultraviolet curable resin, a vinyl acetate resin, a vinyl copolymer resin, an epoxy resin, a urethane resin, an acrylic resin, and the like. However, a resin material with a curing temperature over 150° C. is not used. A heat treatment temperature is, for example, 50° C. or higher and under 90° C. When an epoxy resin is used, by performing a heat treatment for 2 hours at a heat treatment temperature of 80° C., the applied resin can be cured. Also, an adhesive agent, for example a water-soluble adhesive agent can be used as the resin layer 105. When a water-soluble adhesive agent is used, it is convenient because it can be dissolved with water after curing.

When an antenna for an RFID tag is provided, the antenna can be formed by a sputtering method, a screen printing method, or the like so as to be electrically connected to a wire which is connected to a source or drain region of a thin film transistor included in the layer 103 including a thin film transistor. In the case of a sputtering method, the antenna is patterned into a predetermined shape after forming a metal film of aluminum or the like. In the case of a screen printing method, conductive metal paste is baked after it is printed in the predetermined shape of the antenna with the conductive metal paste (for example, a silver paste). When the aforementioned insulating layer is formed, it can be formed so as to cover the antenna.

When a capacitor element used in a DRAM that is a type of memory is provided, the capacitor element is formed so as to be electrically connected to a wire which is connected to a source or drain region of a thin film transistor of the layer 103 including a thin film transistor.

Figure 1D:
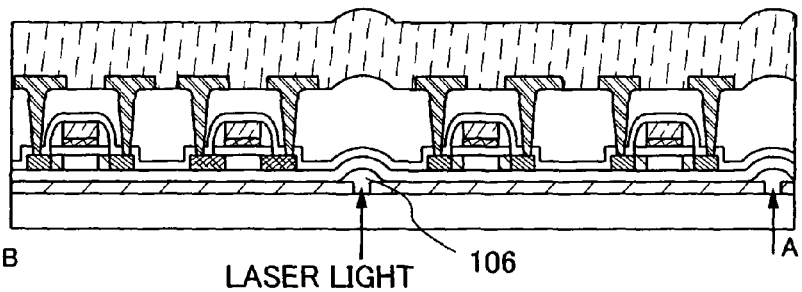

After forming the resin layer 105, a treatment of selectively emitting intense light, specifically laser light, from a rear surface side of the substrate 100 is carried out to form a space 106 by rapidly heating locally to ablate one portion of the peeling layer 101. By the space 106, a film formed over the space is lifted. By this ablation, peeling is made to occur in a periphery of an irradiated region. In this manner, a trigger for peeling is formed (FIG. 1D).

Note that for a laser used in the present invention, continuous wave laser light or pulsed laser light can be used.

There are no particular restrictions on a laser used in the present invention. A laser is structured by a laser medium, an excitation source, and a resonator. When a laser is classified by its laser medium, there are gas lasers, liquid lasers, and solid lasers; when classified by its oscillation characteristic, there are free electron lasers, semiconductor lasers, and x-ray lasers. In the present invention, any of the lasers may be used. However, a gas laser or a solid laser is preferably used, and more preferably, a solid laser is used.

As a gas laser, there are a helium-neon laser, a carbon dioxide gas laser, an excimer laser, and an argon ion laser. An excimer laser includes a rare gas excimer laser and a rare gas halide excimer laser. A rare gas excimer laser oscillates by three kinds of excited molecules of argon, krypton, and xenon. An argon ion laser includes a rare gas ion laser and a metal vapor ion laser.

A liquid laser includes an inorganic liquid laser, an organic chelate laser, and a pigment laser. In an inorganic liquid laser and an organic chelate laser, rare earth ions such as neodymium, which are utilized for a solid laser, are used as a laser medium.

A laser medium used in a solid laser is a solid parent substance doped with active species functioning as a laser. The solid parent substance is a crystal or glass. The crystal is YAG (yttrium aluminum garnet crystal), YLF, $YVO_4$, $YAlO_3$, sapphire, ruby, or alexandrite. In addition, the active species functioning as a laser are, for example, trivalent ions (such as $Cr^{3+}$, $Nd^{3+}$, $Yb^{3+}$, $Tm^{3+}$, $Ho^{3+}$, $Er^{3+}$, and $Ti^{3+}$).

When a ceramic (polycrystalline) is used as the laser medium, the medium can be formed into an arbitrary shape in a short amount of time at low cost. In a case of using a single-crystalline as the medium, a medium having a columnar shape with a diameter of several mm and a length of several tens of mm can usually be used. In the case of using a ceramic (polycrystalline) as a medium, the medium having a columnar shape larger than that of the single-crystalline medium can be formed. The concentration of a dopant such as Nd or Yb in a medium which directly contributes to light emission cannot be changed much in either a single crystal or in a polycrystal. Accordingly, there is a certain amount of limitation in output improvement of a laser by increasing the concentration. However, in the case of using a ceramic as a medium, the medium can be made significantly larger compared to the single-crystal medium; accordingly, a major improvement in output can be expected. In addition, in the case of using a ceramic as a medium, a parallelepiped or a rectangular parallelepiped medium can be formed easily. By using a medium having such a shape and zigzagging oscillation light in the medium, oscillating light path can be lengthened. Accordingly, amplification is increased and oscillation with high output power is possible. Since a laser light emitted from the medium having such a shape has a cross-sectional shape of a square shape during emission, it is advantageous in changing its shape into a linear beam compared to a circular beam. Laser light emitted in such a manner is changed in shape by using an optical system; accordingly, a linear beam having a short side of 1 mm or less and a long side of several mm to several m can be obtained easily. In addition, by evenly irradiating the medium with excitation light, a linear beam has a uniform energy distribution in a long side direction. By irradiating a semiconductor film with this linear beam, an entire surface of the semiconductor film can be annealed uniformly. In the case where uniform annealing to both ends of the linear beam is necessary, a devisal is necessary, such as providing slits on both ends of the beam so as to intercept light of a portion where energy of a linear beam is attenuated.

Note that a condition for laser light irradiation, such as frequency, power density, energy density, or beam profile is appropriately controlled in consideration of thicknesses, materials, or the like of the substrate 100 and the peeling layer 101.

Figure 2A:
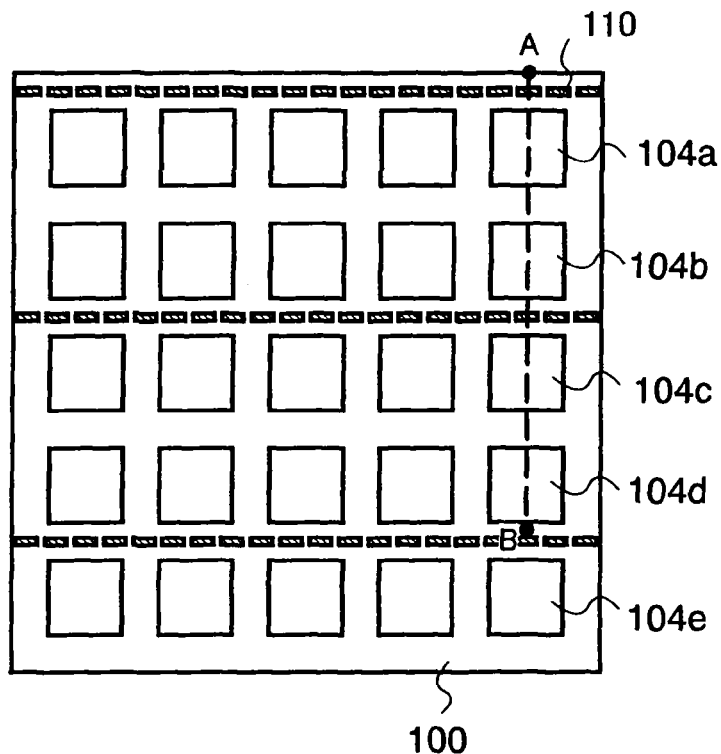
FIGS. 2A and 2B are top views of an example of laser light irradiation.

An example of laser light irradiation is described using a top view of FIG. 2A. A cross-section cut along a dotted line A-B in FIG. 2A corresponds to FIG. 1D. Note that although in the circuits 104a, 104b, 104c, 104d, and 104e each including a thin film transistor, elements such as a plurality of thin film transistors and antennas are formed, only one thin film transistor is shown in the cross-sectional view.

As shown in FIG. 2A, laser light irradiation regions 110 are located between the circuit 104a including a thin film transistor and an end surface of the substrate; between the circuit 104b including a thin film transistor and the circuit 104c including a thin film transistor; and between the circuit 104d including a thin film transistor and the circuit 104e including a thin film transistor. In order to prevent damage to the circuit from laser light irradiation, a position of laser light irradiation is controlled so that the circuits each including a thin film transistor are not irradiated with laser light.

Figure 2B:
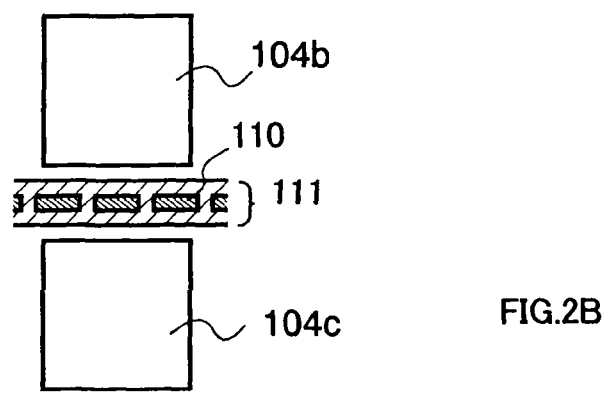

Here, a plurality of rectangular laser light irradiation regions 110 are provided. In the rectangular laser light irradiation regions 110, the peeling layer 101 is eliminated by ablation. FIG. 2B shows a figure of an enlargement of a portion of FIG. 2A. As shown in FIG. 2B, in a periphery of the rectangular laser light irradiation region 110, a region 111 where the film is lifted is formed in a belt-like shape. The region 111 where the film is lifted is a convex portion, and the peeling layer 101 and the layer 103 including a thin film transistor are partially peeled, which forms a space therebetween.

According to the present invention, since a trigger can be formed by emitting a relatively weak laser light (irradiation energy of a laser light source is 1 mJ to 2 mJ) to a rear surface, power of the laser light that is emitted can be minimized, and energy consumption of the entire process can be reduced.

Also, by carrying out laser light irradiation on a rear surface, even if the peeling layer 101 is eliminated, there is practically no damage to a layer or element formed thereover. Further, even if the peeling layer 101 is ablated, microscopic particles are not generated since it is covered by the resin layer 105.

Here, an example of forming three belt-like lifted regions by laser light irradiation is shown; however, it is not particularly limited, and it is acceptable as long as at least one belt-like lifted region is formed between the circuit 104a including a thin film transistor and an end surface of the substrate. Peeling can be carried out smoothly by starting to peel from a spot where a trigger is formed. Also, if a region to be irradiated is reduced, time of laser light irradiation can also be shortened.

It is also possible to peel selectively, and by forming two belt-like lifted regions so as to sandwich a spot where peeling is desirably formed, just the spot sandwiched by the two belt-like lifted regions can be peeled. In this case, forming a lifted region between a circuit including a thin film transistor and an end surface of the substrate is not particularly necessary, and a plurality of lifted regions may be provided so as to surround a periphery of the circuit including a thin film transistor.

However, when a region with a relatively large area is peeled using one trigger, there is concern for a damage occurring during a peeling step, such as a crack, due to stress from a layer including a circuit.

When a plurality of circuits are formed on a substrate having a large area, by only irradiating a plurality of necessary regions with laser light, peeling is possible for each sectionalized region having a relatively small area. As shown in FIG. 2A, by irradiating a plurality of regions with laser light to form a plurality of lifted regions, a region in which the substrate 100 and the peeling layer 101 are in contact is divided into regions having small areas, and damage during peeling, such as a crack, due to stress from a layer including a circuit can be reduced.

Figure 1E:
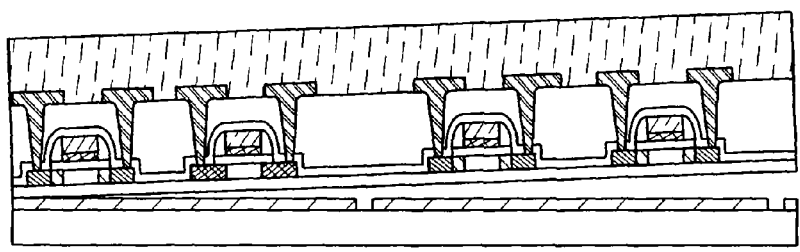

Subsequently, the substrate 100 and the layer 103 including a thin film transistor are separated from each other by peeling from a trigger (here, a belt-like lifted region) using a physical means (FIG. 1E). Note that a portion of the insulating layer 102 and/or the peeling layer 101 (for example a metal oxide) may be stuck to the layer 103 including a thin film transistor.

Peeling by a physical means may be carried out after attaching a substratum to the resin film 105. The substratum may be a base of any composition, such as plastic, glass, metal or ceramics. Also, the physical means is a means that is acknowledged by not chemistry but physics; specifically, the physical means refers to a dynamical or mechanical means having a process based on the rule of dynamics, and refers to a means for changing some dynamical energy (mechanical energy). The physical means is typically a means of applying mechanical force (for example, a means of tearing off by a human hand, or a separation treatment of rotating a roller).

By the above step, the layer 103 including a thin film transistor and the resin layer 105 can be separated from the substrate 100. Subsequently, a flexible substrate or film may be stuck to the layer 103 including a thin film transistor as necessary, as a replacement for the peeled substrate 100.

Then, division into a desired size may be carried out to manufacture chips.

Note that an integrated circuit including a thin film transistor manufactured according to this embodiment mode can have a thickness of 0.2 μm or less, typically 40 nm to 170 nm, and preferably 50 nm to 150 nm. In this manner, thinning of an integrated circuit can be achieved compared to a conventional IC chip which is formed on a silicon wafer.

By the present invention, a substrate can be reused since a relatively weak laser light is used on a rear surface, and there is little damage to the substrate. By reusing the substrate 100, cost can be reduced.

Here, a peeling experiment that was actually carried out is described.

Experiment

Figure 3:
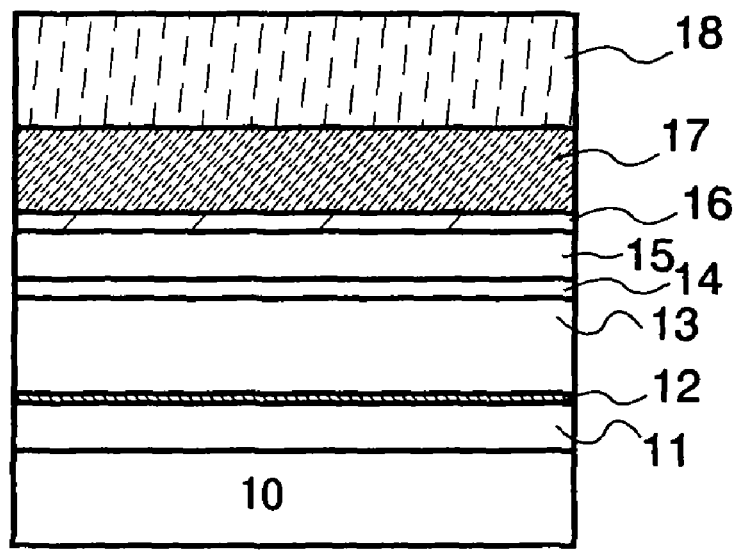
FIG. 3 shows a test sample of a lamination.

A test sample of forming a lamination shown in FIG. 3 over a glass substrate was manufactured, and an experiment of forming a trigger for peeling by laser light irradiation was carried out.

A silicon oxide film 11 including nitrogen was formed over a glass substrate 10 using a plasma CVD method. Note that a film thickness of the silicon oxide film 11 including nitrogen was 100 nm.

Subsequently, a tungsten film 12 was formed with a film thickness of 20 nm by a sputtering method, and a silicon oxide film 13 was formed thereover with a film thickness of 200 nm by a sputtering method.

Then, a silicon nitride oxide film 14 formed with $SiH_4$, $NH_3$, and $N_2O$ as reactive gases; a silicon oxynitride film 15 formed with $SiH_4$ and $N_2O$ as reactive gases; and an amorphous silicon film 16 formed with $SiH_4$ as a reactive gas were laminated by a PCVD method to have thicknesses of 50 nm, 100 nm, and 54 nm, respectively.

Then, an acrylic resin 17 (about 1 μm) was applied over the amorphous silicon film 16 and then cured. Further, a water-soluble adhesive agent 18 was applied by a spin coater and then cured.

A sample of forming a lamination over a glass substrate in a similar manner to the foregoing test sample, but not forming the acrylic resin 17 or the water-soluble adhesive agent 18, was used as a comparative sample.

The test sample and the comparative sample obtained in this manner were irradiated with laser light under a variety of conditions.

As a laser irradiation device, a solid laser (a pulse excitation Q switch Nd:YAG laser) of a Laser Micro Cutter LR-2100ST (manufactured by HOYA Corporation) was used, and a second harmonic (532 nm) and a third harmonic (355 nm) of a fundamental wave were used. A power of a laser light source of this laser irradiation device is 2 mJ for the second harmonic and 1 mJ for the third harmonic. Also, this laser irradiation device marks energy emitted through an optical system on a scale of 1 to 200. A scale value of 200 is the largest value of irradiation energy to an irradiation object, and a scale value of 1 is the smallest value. In this specification, numerical value of this scale is called energy intensity.

When irradiation was carried out from a rear surface side by changing sizes of a rectangular laser spot (sizes: 10 μm×20 μm, 10 μm×40 μm, 10 μm×60 μm, 20 μm×60 μm, 40 μm×60 μm, and 60 μm×60 μm) using the second harmonic (532 nm), lifting in a film was confirmed for all energy intensities 100, 150, and 200.

For the third harmonic (355 nm) also, although it depended on a size of the laser spot, lifting in a film was confirmed for all energy intensities 100, 150, and 200. A condition in which lifting could not be confirmed was when the spot size was 40 μm×60 μm and 60 μm×60 μm, in the third harmonic (355 nm) when energy intensity was 100.

Figure 4A:
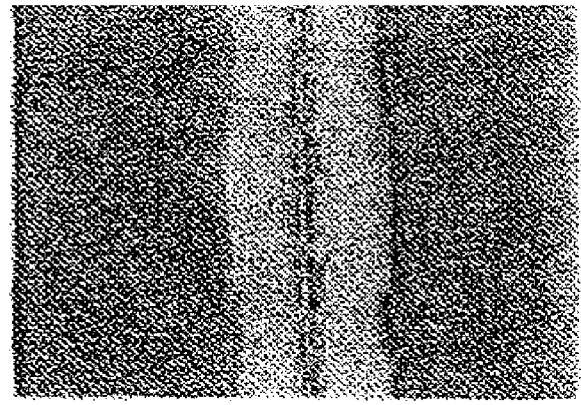
FIGS. 4A and 4B is a picture of an observation made from above after laser light irradiation is carried out on a rear surface, and a picture of an observation made from above after laser light irradiation is carried out from a front surface, respectively.
Figure 7:
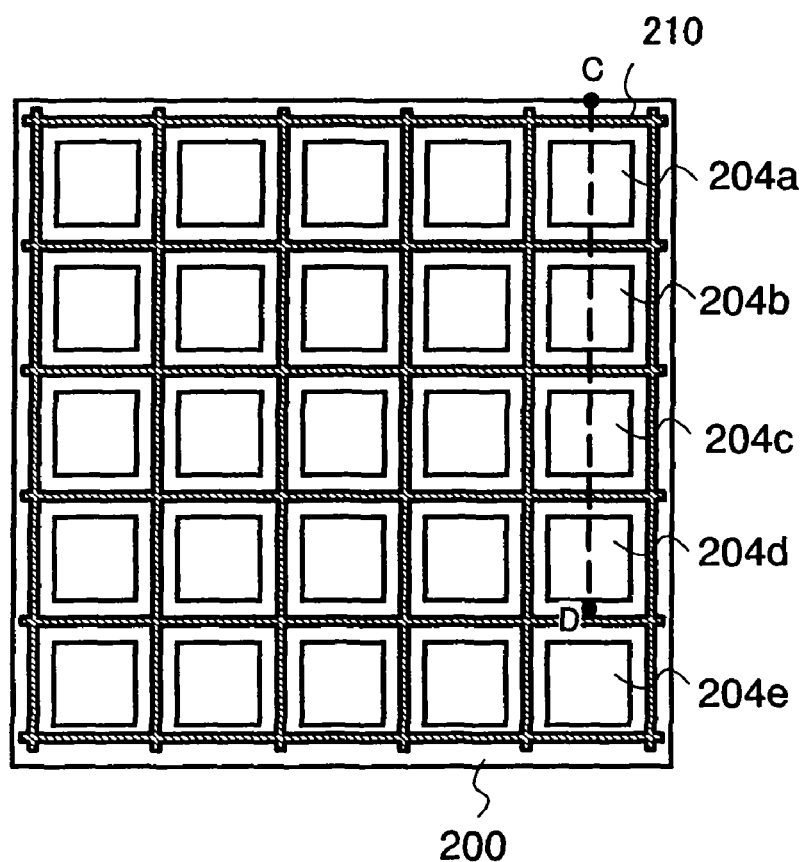
FIG. 7 is a top view of an example of laser light irradiation according to Embodiment Mode 2.

Further, FIG. 4A shows a picture of observing from above an irradiation of a region of about 5 cm with rectangular laser spots in a single line, from a rear surface side of the substrate. The third harmonic (355 nm) was used, and an irradiation condition was an energy intensity of 200 and a spot size of 6 μm×40 μm. In FIG. 4A, 6 to 7 laser spots and a discoloration portion in a peripheral region thereof could be observed. The discoloration portions show regions where the film is lifted. When an adhesion tape was stuck on a water-soluble adhesive agent surface and peeling was attempted, the peeling could be carried out smoothly. From this, it was confirmed that a periphery of a rear surface laser light irradiation region functions as a trigger for peeling.

Figure 5:
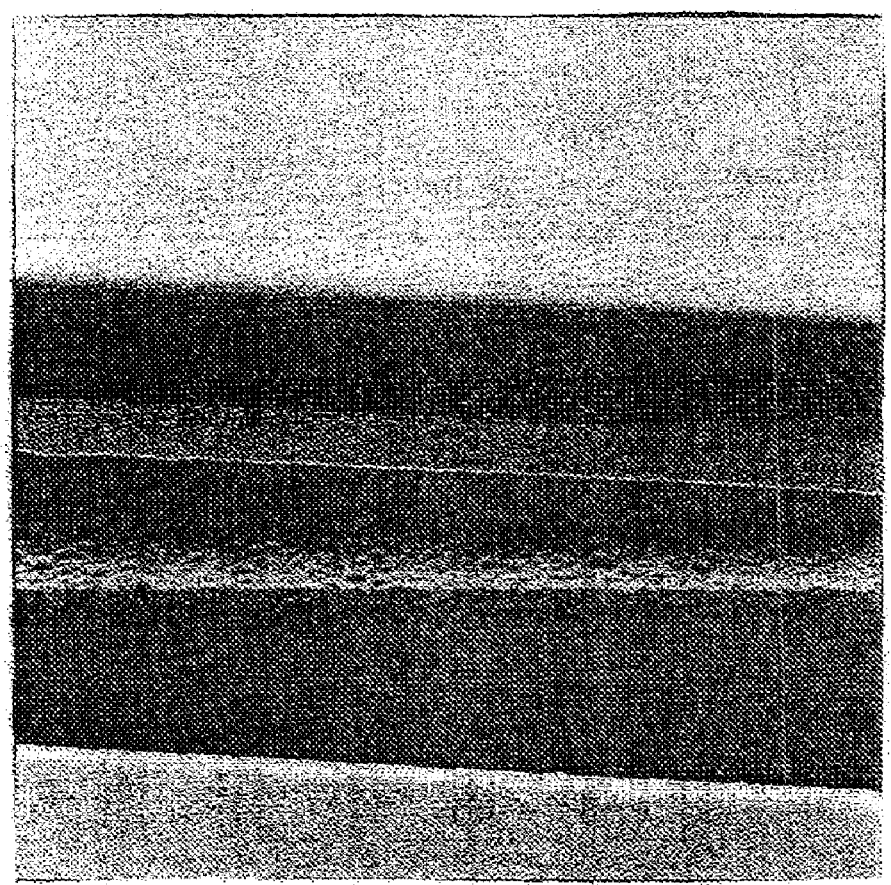
FIG. 5 is a cross-sectional TEM picture of a region where there is a lift in a film.

A cross-sectional TEM picture of a region where the film is lifted is shown in FIG. 5. From FIG. 5, it was confirmed that a cavity, in other words a space, was formed between the tungsten film 12 and the silicon oxide film 13.

Figure 4B:
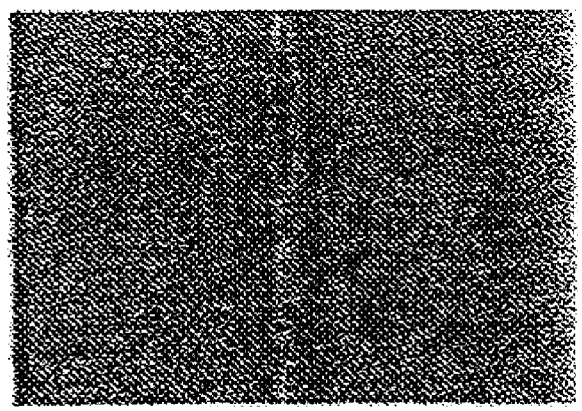

For comparison, FIG. 4B shows a picture of observing from above an irradiation of a region of about 5 cm with rectangular laser spots in a single line, from a front surface side. The third harmonic (355 nm) was used, and irradiation condition was an energy intensity of 200 and a spot size of 6 μm×40 μm. In FIG. 4B also, slight discoloration portions in peripheral regions of laser spots could be confirmed; however, the discoloration portions were not regions where the film was lifted. Further, in a case of carrying out laser light irradiation from a front surface side, when an adhesion tape was stuck on a water-soluble adhesive agent surface and peeling was attempted, it did not peel, and a periphery of a laser light irradiation region did not function as a trigger for peeling.

A similar test result was obtained by using only an acrylic resin. Also, a similar test result was obtained by laminating only the water-soluble adhesive agent over an amorphous silicon film, and then irradiating from a rear surface side of a substrate with laser light.

Here, an example using a top-gate TFT is described; however, the present invention can be applied regardless of a TFT structure, and it can be applied to a bottom-gate (inversely staggered type) TFT or a staggered TFT, for example.

Embodiment Mode 2

In Embodiment Mode 1, an example of forming the resin layer 105 over the layer 103 including a thin film transistor and then carrying out laser light irradiation on a rear surface is shown. In this embodiment mode, an example of providing a resin layer for at least one layer of the layers including thin film transistors and then carrying out laser light irradiation on a rear surface is shown.

First, similarly to Embodiment Mode 1, a peeling layer 201 is laminated over a glass substrate 200, and if necessary, an insulating layer 202 is laminated thereover (FIG. 6A). Subsequently, when a layer 203 including a thin film transistor is formed over the peeling layer 201 (if forming the insulating layer 202, over the insulating layer 202), an insulating film 205 made of an organic resin is formed as one layer of an interlayer insulating film. Here, an acrylic resin with a film thickness of several μm is used as the insulating film 205 made of an organic resin.

After forming the insulating film 205 made of an organic resin as the interlayer insulating film, a wire connected to a source or drain region of a thin film transistor is formed (FIG. 6B). If necessary, an antenna that is electrically connected to this wire is formed by a sputtering method, a screen printing method, or the like.

Subsequently, a treatment of selectively emitting intense light, specifically laser light, to a rear surface side of the substrate 200 is carried out to form a space 206 by rapidly heating locally to ablate one portion of the peeling layer 201 (FIG. 6C).

By the space 206, a film formed over the space is lifted. By ablation, peeling is caused in a periphery of an irradiated region. In this manner, a trigger for peeling is formed.

Note that a condition for laser light irradiation, such as frequency, power density, energy density, or beam profile is appropriately controlled in consideration of thicknesses, materials, or the like of the substrate 200 and the peeling layer 201.

An example of laser light irradiation different from that of Embodiment Mode 1 is described using the top view in FIG. 7. A cross-section cut along a dotted line C-D in FIG. 7 corresponds to FIG. 6C. Note that although in circuits 204a, 204b, 204c, 204d, and 204e each including a thin film transistor, elements such as a plurality of thin film transistors and antennas are formed, only one thin film transistor is shown in the cross-sectional view.

As shown in FIG. 7, a laser light irradiation region 210 is between end surfaces of the substrate and each of the circuits each including a thin film transistor, and between adjacent circuits. In order to prevent damage to the circuits from laser light irradiation, a position of laser light irradiation is controlled so that the circuits each including a thin film transistor are not irradiated with laser light.

Here, linear laser light is emitted so that the laser light irradiation region 210 is provided to have a lattice shape. In the lattice-shaped laser light irradiation region 210, the peeling layer 201 is eliminated by ablation. In a periphery of the lattice-shaped laser light irradiation region 210, a region in which a film is lifted is formed. The region in which the film is lifted becomes a convex portion, and the peeling layer 201 and the layer 203 including a thin film transistor are partially detached which forms a space therebetween.

In this embodiment mode, by providing the lattice-shaped laser light irradiation region 210, peeling can be carried out smoothly regardless of a direction from which the peeling is carried out.

Subsequently, the substrate 200 and the layer 203 including a thin film transistor are separated by peeling through a physical means (FIG. 6D). Note that a portion of the insulating layer 202 and/or the peeling layer 201 (for example, a metal oxide) may be stuck to the layer 203 including a thin film transistor.

By the above step, the insulating film 205 made of an organic resin and the layer 203 including a thin film transistor can be separated from the substrate 200. Subsequently, a flexible substrate or film may be stuck to the layer 203 including a thin film transistor as necessary, as a replacement for the peeled substrate 200.

Then, division into a desired size may be carried out to manufacture chips.

Further, in this embodiment mode, compared to Embodiment Mode 1, a step of forming a water-soluble adhesive agent can be abbreviated.

This embodiment mode can be freely combined with Embodiment Mode 1.

Embodiment Mode 3

Figure 8A:
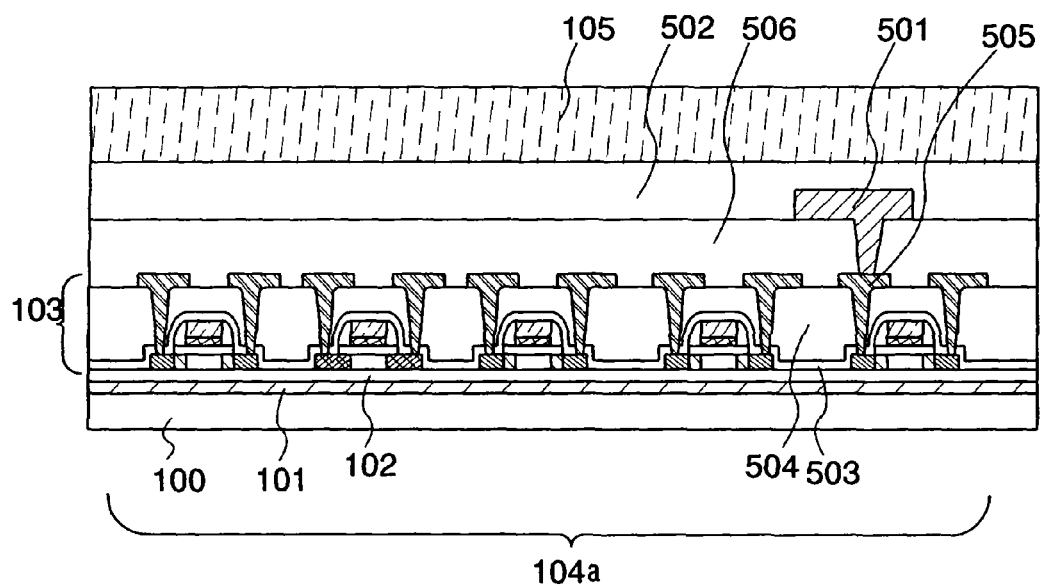
FIGS. 8A and 8B are cross-sectional views of a manufacturing process of an RFID tag.
Figure 8B:
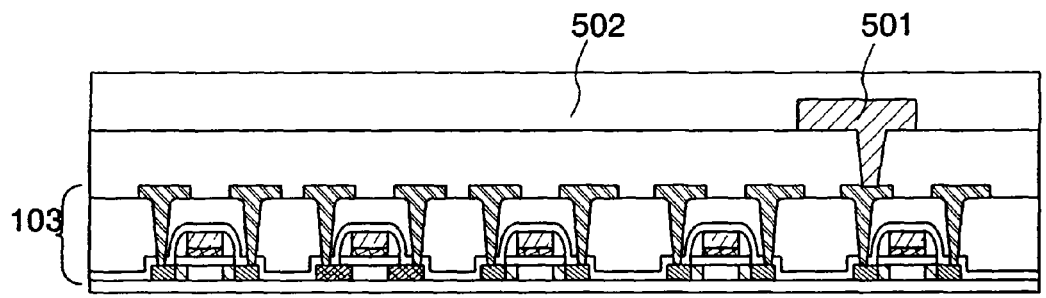

In this embodiment mode, an example of providing an antenna 501 over the layer 103 including a thin film transistor is shown in FIG. 8A and FIG. 8B. Note that the same reference numerals are used for the same parts as Embodiment Mode 1.

A wire 505 connected to a source or drain region of a thin film transistor in the layer 104a including a thin film transistor is provided, via a contact hole formed in a passivation film 503 (also called a protective film) and a first interlayer insulating film 504. A second interlayer insulating film 506 is provided over the wire 505 connected to the source or drain region, and the antenna 501 is provided over the second interlayer insulating film 506 so as to be electrically connected to the wire 505. Since an insulating layer 502 is formed so as to cover the antenna 501, an effect of protecting the antenna 501 can be expected. Then, the resin layer 105 is formed over the insulating layer 502 (FIG. 8A). The insulating layer 502 also has an effect of reinforcing the antenna 501 and the layer 103 including a thin film transistor.

Also, in the circuit 104a including a thin film transistor shown in FIG. 8A, five thin film transistors and one antenna 501 are shown in the cross-sectional view; however, it is not particularly limited, and many more thin film transistors, antennas, and other semiconductor elements may be provided.

The passivation film 503 which is provided to protect a thin film transistor is formed with an inorganic insulating film such as silicon nitride, silicon nitride including oxygen, and silicon nitride including nitrogen (silicon oxynitride) by, for example, a CVD method. At this time, plasma oxidation or plasma nitridation may be carried out using an apparatus capable of generating with no magnetic field the previously mentioned plasma having high electron density and low electron temperature. Formation of the inorganic insulating film and either plasma oxidation or plasma nitridation may be continuously carried out. At this time, a multi-chamber apparatus provided with a chamber for CVD and a chamber for plasma treatment can be used.

As the first interlayer insulating film 504 and the second interlayer insulating film 506, an inorganic insulating film or an organic insulating film can be used. In particular, by using an organic resin film such as an acrylic resin, a polyimide resin, or a siloxane material, when laser light irradiation is carried out selectively from a rear surface side to form a trigger for peeling, a space can be formed under the organic resin film, and a lift in a periphery of an irradiated spot of the film can be caused. By covering with the organic resin film, generation of particles can be suppressed.

The wire 505 connected to the source or drain region preferably has a stacked structure of two or more layers when it is formed with a material mainly containing aluminum. For example, a stacked structure of a first layer mainly containing aluminum and a second layer mainly containing a highly heat-resistant refractory metal (titanium, molybdenum, tantalum, tungsten, or the like), or a three layer structure where the first layer is sandwiched between the second layers may be formed successively by a sputtering method without exposing to atmospheric air.

After forming the resin layer 105, similarly to Embodiment Mode 1, a treatment of selectively emitting intense light, specifically laser light, to a rear surface side of the substrate 100 is carried out to form a space by rapidly heating locally to ablate one portion of the peeling layer 101. By the space, a film formed over the space is lifted. By this ablation, peeling is caused in a periphery of an irradiated region.

Subsequently, peeling is carried out from a trigger (here, a region in which the film is lifted) by a physical means, to separate the substrate 100 and the layer 103 including a thin film transistor.

FIG. 8B shows the layer 103 including a thin film transistor after peeling the resin layer 105 and the substrate 100 in FIG. 8A. Because the insulating layer 502 is provided, the strength of the layer 103 including a thin film transistor still increases even after the substrate 100 is peeled, and the destruction of the layer 103 including a thin film transistor can be suppressed. In addition, the insulating layer 502 also has an effect of protecting the antenna 501.

This embodiment mode can be freely combined with Embodiment Mode 1 or Embodiment Mode 2.

By the following embodiment, a more detailed description is made on the present invention formed by the above structure.

Embodiment 1

An example of a memory manufactured using a layer including a transistor obtained by the invention disclosed in this specification is shown.

Figure 9A:
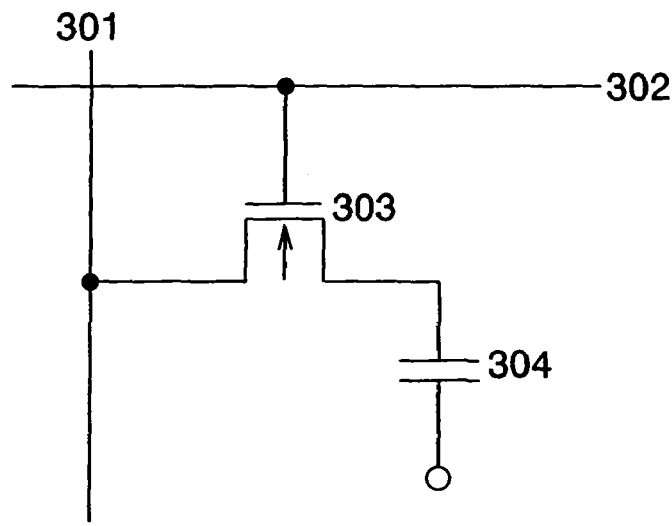
FIGS. 9A and 9B are circuits each showing an example of a memory cell structure.

FIG. 9A is a circuit diagram showing an example of a memory cell structure of a DRAM (Dynamic Random Access Memory), and the DRAM includes a bit line 301, a word line 302, a transistor 303, and a capacitor element 304. In practice, a plurality of memory cells having such structures are arranged vertically and horizontally.

Figure 9B:
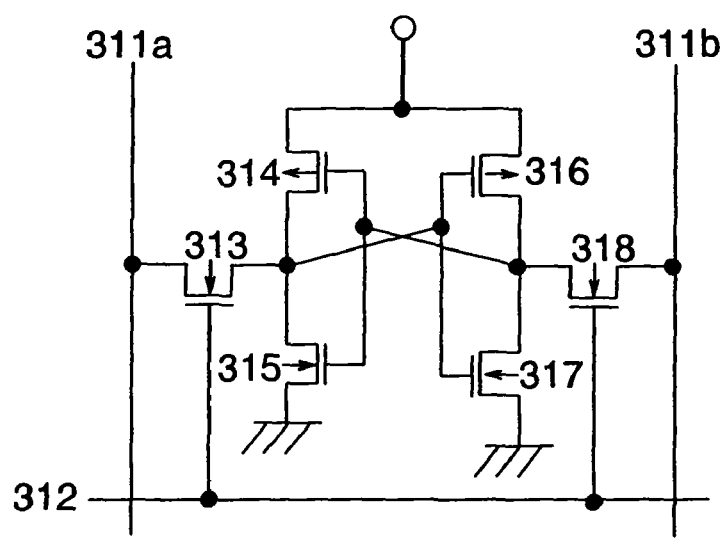

FIG. 9B is a circuit diagram showing an example of a memory cell structure of an SRAM (Static Random Access Memory), and the SRAM includes a bit line 311a, a bit line 311b, a word line 312, and transistors 313, 314, 315, 316, 317, and 318. In practice, a plurality of memory cells having such structures are arranged in vertically and horizontally.

By using the layer 103 including a thin film transistor obtained according to Embodiment Mode 1 or 2 in this specification in the case of manufacturing a memory as shown in FIGS. 9A and 9B, a memory, which is dramatically thinner than a memory formed on a silicon wafer, having a flexible property can be manufactured at low cost.

The invention disclosed in this specification can also be applied to a memory other than the DRAM and the SRAM, and a CPU.

This embodiment can be freely combined with Embodiment Mode 1, Embodiment Mode 2, or Embodiment Mode 3.

Embodiment 2

An example of an RFID tag (wireless IC tag) manufactured using a layer including a transistor obtained by the invention disclosed in this specification is shown.

Figure 10A:
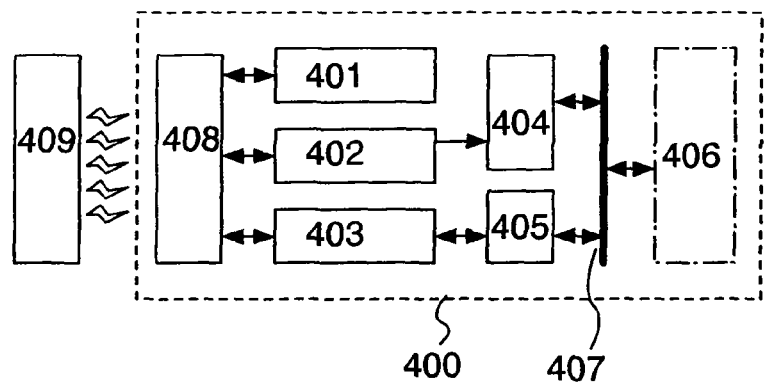
FIGS. 10A and 10B are block diagrams each showing an example of an RFID tag.
Figure 10B:
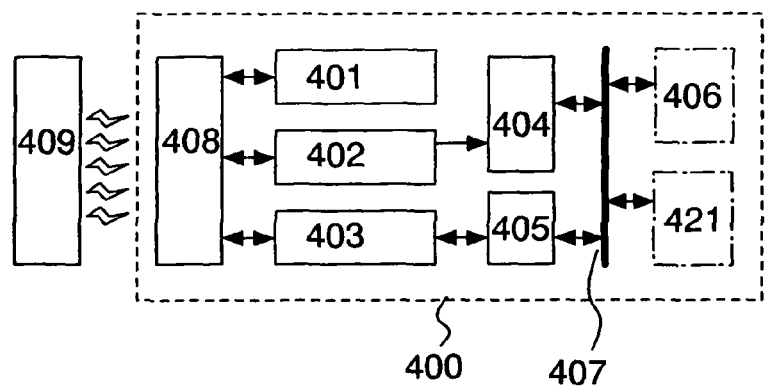
Figure 11A:
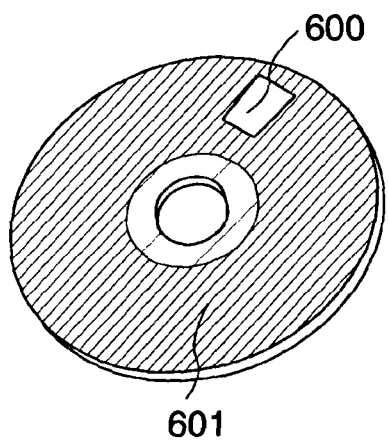
FIGS. 11A to 11D each show an example of use of an RFID tag.
Figure 11B:
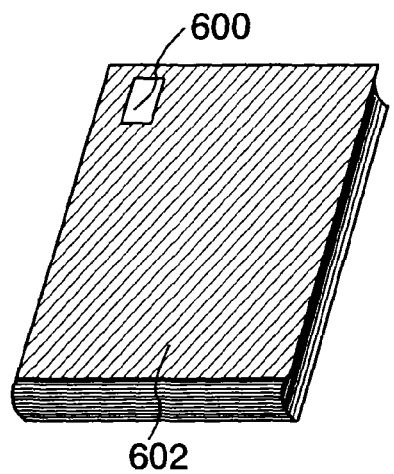
Figure 11C:
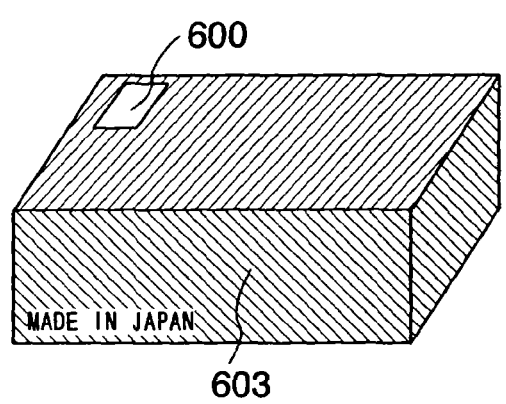
Figure 11D:
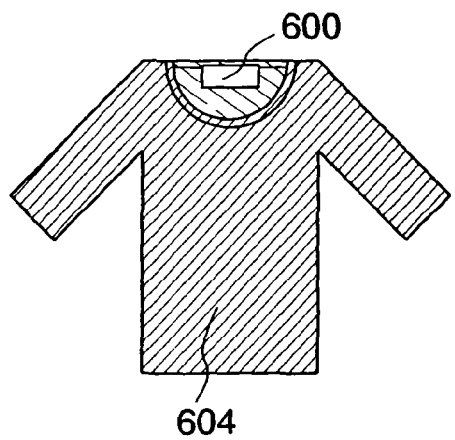

FIGS. 10A and 10B are block diagrams of an example of the RFID tag. An RFID tag 400 can communicate data without contact, and includes a power source circuit 401, a clock generating circuit 402, a data demodulation/modulation circuit 403, a control circuit 404, an interface circuit 405, a memory circuit 406, a bus 407, and an antenna 408. FIG. 10B shows a case where a CPU 421 is provided in addition to the components of FIG. 10A.

The power source circuit 401 generates a power source based on an AC signal that is inputted from the antenna 408. The clock generating circuit 402 generates a clock signal based on a signal that is inputted from the antenna 408. The data demodulation/modulation circuit 403 demodulates/modulates data that is communicated with a reader/writer 409. The control circuit 404 controls the memory circuit 406. The antenna 408 carries out receiving of signals and sending of data.

As the memory circuit 406, a mask ROM, an EPROM (Erasable Programmable Read Only Memory), an EEPROM (Electrically Erasable Programmable Read Only Memory), a flash memory, an organic memory, or the like can be used, other than the DRAM or the SRAM described in Embodiment 1 of this specification. Note that the organic memory has a structure in which an organic compound layer is provided between a pair of electrodes or a structure in which a layer including an organic compound and an inorganic compound is provided between a pair of electrodes. By adopting the organic memory as the memory circuit 406 of the RFID tag, a contribution in reducing size, thickness, and weight of the RFID tag can be made.

FIGS. 11A to 11D show examples of uses of the RFID tag. By mounting the RFID tag as described in this embodiment on a product such as a recording medium 601 on which music or a movie is recorded, a case in which the recording medium 601 is housed, a book 602, a product package 603, or clothing 604, management of sales, stock, renting, or the like, prevention of loss or theft, or the like of the product on which the RFID tag is mounted can be achieved. In each of FIGS. 11A to 11D, an example of position 600 of an RFID tag is shown.

By using the layer 103 including a thin film transistor obtained according to Embodiment Mode 1, 2, or 3 in this specification in manufacturing the RFID tag as shown in FIGS. 10A and 10B, the RFID tag can be thinned and supplied at low cost. Therefore, the invention disclosed in this specification can contribute to widespread use of RFID tags.

Also, this embodiment can be freely combined with Embodiment Mode 1, 2, or 3, or Embodiment 1.

By the present invention, since a trigger for peeling can be formed in a short amount of time by laser light irradiation with relatively low energy, manufacturing cost can be reduced. Also, by the present invention, a peeling method that does not damage a layer to be peeled can be provided, and it is possible to peel a layer to be peeled without peeling defectively over an entire surface, not only for peeling a layer to be peeled that has a small area but also for a layer to be peeled that has a large area.

What is claimed is:

1. A manufacturing method of a semiconductor device, comprising: forming a metal layer over a substrate having a light transmitting property; forming an insulating layer over the metal layer; forming a layer including a semiconductor element over the insulating layer; applying a resin material over the layer including the semiconductor element; curing the resin material; carrying out irradiation selectively with light from a rear surface side of the substrate to ablate the metal layer in a region selectively irradiated with the light.

2. The manufacturing method of a semiconductor device according to claim 1, wherein in the region selectively irradiated with the light and a periphery thereof, a space is formed between the metal layer and the insulating layer.

3. The manufacturing method of a semiconductor device according to claim 1, wherein the region selectively irradiated with the light is located in a region between the semiconductor element and a rim of the substrate.

4. The manufacturing method of a semiconductor device according to claim 1, wherein the light is laser light.

5. The manufacturing method of a semiconductor device according to claim 1, wherein the region selectively irradiated with the intense light has a dot form or a linear form.

6. The manufacturing method of a semiconductor device according to claim 1, wherein the metal layer is a film mainly containing an element selected from the group consisting of tungsten (W), titanium (Ti), molybdenum (Mo), niobium (Nb), nickel (Ni), cobalt (Co), zirconium (Zr), zinc (Zn), ruthenium (Ru), rhodium (Rh), palladium (Pd), osmium (Os), and iridium (Ir).

7. A manufacturing method of a semiconductor device, comprising: forming a metal layer over a substrate having a light transmitting property; forming an insulating layer over the metal layer; forming a layer including a first semiconductor element and a second semiconductor element over the insulating layer; applying a resin material over the layer including the first semiconductor element and the second semiconductor element; curing the resin material; carrying out irradiation selectively with light from a rear surface side of the substrate; and separating the substrate from the layer including the first semiconductor element and the second semiconductor element.

8. The manufacturing method of a semiconductor device according to claim 7, wherein in a region selectively irradiated with the light and in a periphery thereof, a space is formed between the metal layer and the insulating layer.

9. The manufacturing method of a semiconductor device according to claim 7, wherein a region selectively irradiated with the light is located in a region between the first semiconductor element and the second semiconductor element, a region between the first semiconductor element and a rim of the substrate, or a region between the second semiconductor element and a rim of the substrate.

10. The manufacturing method of a semiconductor device according to claim 7, wherein the light is laser light.

11. The manufacturing method of a semiconductor device according to claim 7, wherein a region selectively irradiated with the intense light has a dot form or a linear form.

12. The manufacturing method of a semiconductor device according to claim 7, wherein the metal layer is a film mainly containing an element selected from the group consisting of tungsten (W), titanium (Ti), molybdenum (Mo), niobium (Nb), nickel (Ni), cobalt (Co), zirconium (Zr), zinc (Zn), ruthenium (Ru), rhodium (Rh), palladium (Pd), osmium (Os), and iridium (Ir).

13. A manufacturing method of a semiconductor device, comprising: forming a metal layer over a substrate having a light transmitting property; forming an insulating layer over the metal layer; forming a layer including a plurality of semiconductor elements over the insulating layer; applying a resin material over the layer including the plurality of semiconductor elements; curing the resin material; carrying out irradiation selectively with light from a rear surface side of the substrate to remove a portion of the metal layer; and separating the substrate from the layer including the plurality of semiconductor elements.

14. The manufacturing method of a semiconductor device according to claim 13, wherein the light is laser light.

15. The manufacturing method of a semiconductor device according to claim 13, wherein a region selectively irradiated with the light has a dot form or a linear form.

16. The manufacturing method of a semiconductor device according to claim 13, wherein the metal layer is a film mainly containing an element selected from the group consisting of tungsten (W), titanium (Ti), molybdenum (Mo), niobium (Nb), nickel (Ni), cobalt (Co), zirconium (Zr), zinc (Zn), ruthenium (Ru), rhodium (Rh), palladium (Pd), osmium (Os), and iridium (Ir).

17. A manufacturing method of a semiconductor device, comprising: forming a metal layer over a substrate having a light transmitting property; forming an insulating layer over the metal layer; forming over the insulating layer a layer including a plurality of semiconductor elements as well as at least one layer of an organic resin layer; carrying out irradiation selectively with light from a rear surface side of the substrate to remove a portion of the metal layer; and separating the substrate from the layer including the plurality of semiconductor elements.

18. The manufacturing method of a semiconductor device according to claim 17, wherein the light is laser light.

19. The manufacturing method of a semiconductor device according to claim 17, wherein a region selectively irradiated with the light has a dot form or a linear form.

20. The manufacturing method of a semiconductor device according to claim 17, wherein the metal layer is a film mainly containing an element selected from the group consisting of tungsten (W), titanium (Ti), molybdenum (Mo), niobium (Nb), nickel (Ni), cobalt (Co), zirconium (Zr), zinc (Zn), ruthenium (Ru), rhodium (Rh), palladium (Pd), osmium (Os), and iridium (Ir).

* * * * *